(12) United States Patent
Schlack

(10) Patent No.: US 7,397,674 B2
(45) Date of Patent: Jul. 8, 2008

(54) COMPACT PCI EJECTOR LATCH

(75) Inventor: Richard E. Schlack, Rising Sun, MD (US)

(73) Assignee: Southco, Inc., Concordville, PA (US)

( * ) Notice: Subject to any disclaimer, the term of this patent is extended or adjusted under 35 U.S.C. 154(b) by 419 days.

(21) Appl. No.: 10/852,480

(22) Filed: May 25, 2004

(65) Prior Publication Data

US 2004/0246695 A1    Dec. 9, 2004

Related U.S. Application Data

(60) Provisional application No. 60/477,274, filed on Jun. 9, 2003.

(51) Int. Cl.
  *H05K 7/14* (2006.01)
  *H05K 7/18* (2006.01)
(52) U.S. Cl. .......... 361/801; 361/802; 361/754
(58) Field of Classification Search ........ 361/801, 361/754, 740, 756, 727, 732, 747, 726, 802, 361/737; 439/160
See application file for complete search history.

(56) References Cited

U.S. PATENT DOCUMENTS

| | | | |
|---|---|---|---|
| 960,386 A | 6/1910 | Obert | |
| 3,325,200 A | 6/1967 | Fowler | |
| 3,409,320 A | 11/1968 | Eckerle | |
| 3,748,881 A | 7/1973 | Erickson | |
| 3,964,280 A | 6/1976 | Kelton | |
| 3,970,213 A | 7/1976 | Clay | |
| 4,181,333 A | 1/1980 | Stelma | |
| 4,704,882 A * | 11/1987 | Takasaki | ........... 70/215 |
| 4,705,308 A | 11/1987 | Bisbing | |
| 4,707,006 A | 11/1987 | Garg et al. | |
| 4,763,935 A | 8/1988 | Bisbing | |
| 4,858,970 A | 8/1989 | Tedesco et al. | |
| 4,972,691 A | 11/1990 | Knight | |
| 4,973,091 A | 11/1990 | Paulson et al. | |
| 4,991,886 A | 2/1991 | Nolte et al. | |
| 4,996,631 A | 2/1991 | Freehauf | |
| 5,201,557 A | 4/1993 | Schlack | |
| 5,219,195 A | 6/1993 | Lawrence | |
| 5,222,897 A | 6/1993 | Collins et al. | |
| 5,375,894 A | 12/1994 | Schlack | |
| 5,413,391 A | 5/1995 | Clavin et al. | |
| 5,504,656 A * | 4/1996 | Joist | ........... 361/754 |
| 5,669,512 A | 9/1997 | Joslin | |

(Continued)

*Primary Examiner*—Hung S Bui
(74) *Attorney, Agent, or Firm*—Paul & Paul

(57) ABSTRACT

A latch for a Compact PCI board, which incorporates inject and eject and engage and disengage functions, has a low profile shape, whereof a fold-down handle operates through a total arc of 90 degrees. Enhanced electromagnetic compatibility (EMC) is provided, by more efficient EMC shielding and by reduced electromagnetic force (EMF) radiation pass-through. The latch, in its inject/eject operation, undergoes a two-phase motion, which utilizes a rotary motion to insert/extract the board from electrical connection, and utilizes a linear motion to engage/disengage the latch pawl from the chassis (keeper). A separate alignment pin block, normally carrying a lead guide pin and a seating guide pin, is independent of the structure for the base of the latch. This permits the alignment pin block to be mounted to the inside of the faceplate and the latch to be mounted to the outside of the faceplate. By so doing, the cumulative (aggregate) area of the opening(s) through the faceplate is reduced, which thereby increases the EMC (electromagnetic compatibility) of the design by reducing EMF radiation pass-through.

22 Claims, 12 Drawing Sheets

U.S. PATENT DOCUMENTS

| | | | |
|---|---|---|---|
| 5,732,987 A | | 3/1998 | Wright et al. |
| 5,781,417 A | | 7/1998 | Albani et al. |
| 5,984,382 A | | 11/1999 | Bourne et al. |
| 6,094,353 A | * | 7/2000 | Koerber et al. ............... 361/754 |
| 6,109,669 A | | 8/2000 | Pinkow |
| 6,147,872 A | * | 11/2000 | Roy ............................ 361/754 |
| 6,174,007 B1 | | 1/2001 | Schlack et al. |
| 6,203,075 B1 | | 3/2001 | Wells, Jr. et al. |
| 6,203,076 B1 | | 3/2001 | Wytcherley et al. |
| 6,220,879 B1 | * | 4/2001 | Ulrich ........................ 439/160 |
| 6,371,786 B1 | | 4/2002 | Howell et al. |
| 6,373,713 B1 | * | 4/2002 | Jensen et al. ................. 361/759 |
| 6,565,135 B2 | | 5/2003 | Wytcherley et al. |
| 6,685,489 B1 | * | 2/2004 | Rubenstein et al. ......... 439/157 |
| 6,957,979 B2 | * | 10/2005 | Welsh et al. ................. 439/565 |
| 2002/0116785 A1 | | 8/2002 | Wytcherley et al. |

* cited by examiner

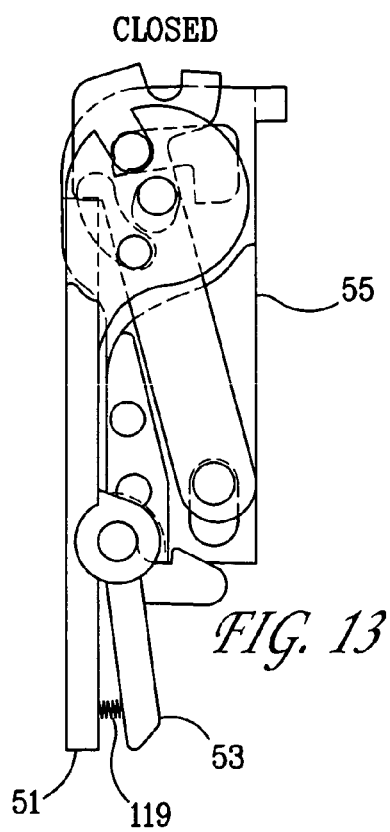
FIG. 13 CLOSED
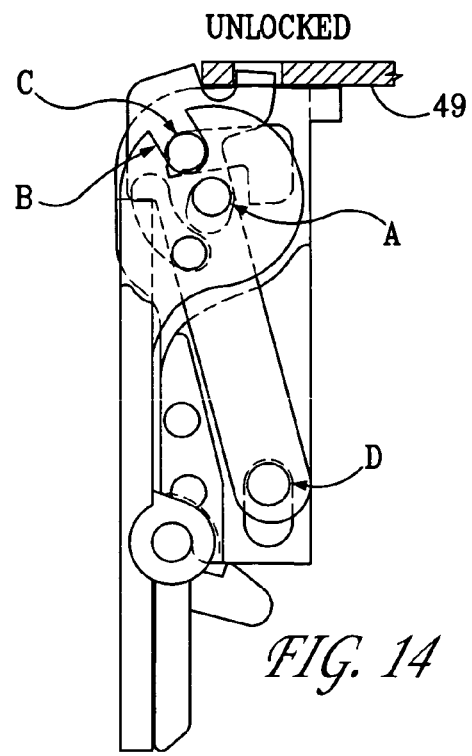
FIG. 14 UNLOCKED
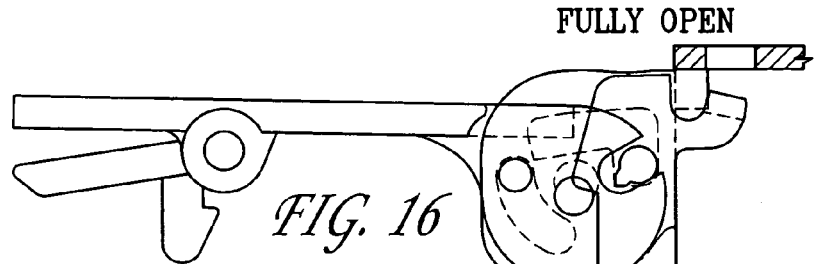
FIG. 16 FULLY OPEN
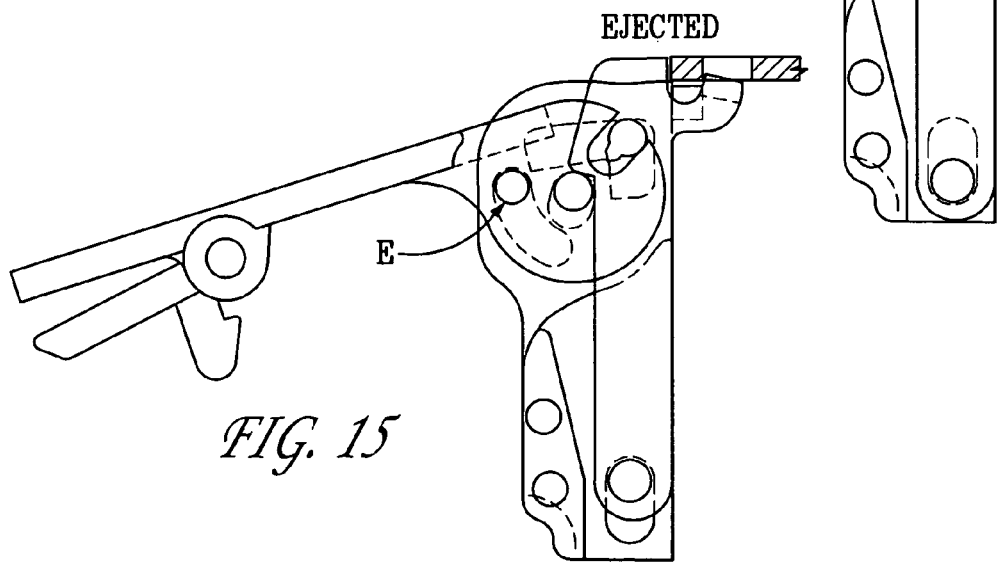
FIG. 15 EJECTED

COMPACT PCI EJECTOR LATCH

RELATED APPLICATIONS

Applicant claims the benefit under 35 United States Code 119(e) of U.S. Provisional Application Ser. No. 60/477,274, filed Jun. 9, 2003 on the present invention, and incorporates the disclosure thereof herein by reference.

BACKGROUND OF THE INVENTION

The present invention relates to latches and levers, specifically ejector latches and ejector levers which may be adapted for use to secure and release computer-type boards in racks and cabinets, such as large boards known as peripheral component interconnect (PCI) boards. These boards are used to hold such electronic components as processor circuits, banks of switches, banks of transducers, transformers and other components and modules. Such PCI boards are generally larger than PC boards (personal computer boards) and can be generally square or rectangular in shape; and are generally sized from six (6) inch to ten (10) inches on a side. Compared to the much larger boards, previously used in the computer, the switching circuit, and the telecommunications industries, these boards have become known as compact PCI boards. It important to be able to easily insert such a module carrying PCI board with a positive snap-in connection and positive snap-out release. Moreover, it is important to have an insertion aid and/or a pull-out aid, such as a handle or a hold. This snap-in and snap-out operation has been implemented with ejector latches.

However, these latches must also comply with the general industry standards for this type of latch, including the standards for mounting on a faceplate on the front of a board, and the engagement with the chassis mounted flange, which acts as combination guide block and keeper. These standards are defined as a subset of IEEE1101.1 and IEEE1101.10 specifications known as Compact PCI (PICMG 2.0) standards. Many inject/eject latches are in the marketplace and meet these standards. Examples are those sold by manufacturers such as Rittal, Schroff, Elma and Bivar. As manufactures are using higher frequency circuits on compact PCI boards, electromagnetic compatibility (EMC) is becoming an increasing concern. The existing prior art ejector latch configuration requires a large cutout in the aluminum faceplate normally mounted to the outside edge of a compact PCI board. This large cutout often is a source of electromagnetic radiation. Furthermore, such prior art compact PCI board latches often do not have a low profile and generally have a limited degree of movement and mechanical leverage.

FIG. 1 shows a typical example of a prior art compact PCI board 21 with a pair of prior art inject/eject latches 23 mounted on its outboard edge faceplate 25. Chassis connectors 27 have wire leads 29 into the board 21. Each latch 23 includes a base/alignment pin block 31 that carries a larger leading guide pin 33 and a smaller seating guide pin 35.

FIG. 2 shows a perspective side view of the prior art pin 33 of FIG. 1 showing the single structure combination housing 37 having a claw-shaped end pawl 37a and a thumb handle 37b. The base/alignment pin block 31 is a casting with a number of openings and shoulders. A spring biased release button 39 is shown in FIG. 3, which is a longitudinal cross-sectional view of FIG. 2 taken as shown in FIG. 2. The spring 41 biases the thumb release button away from the pawl 37a to have a projection shoulder 39a extend through the opening in the back of the housing 37 to prohibit the rotation thereof and to keep the pawl 37a locked in position.

This prior art device has a high profile and its faceplate mounting with relatively large cutout results in a relatively large amount of EMF signal leakage (electromagnetic frequency radiation).

The IEEE Compact PCI specification defines the location, with respect to a chassis, of the faceplate in its fully inserted and fully extracted positions, where fully extracted is defined as being loose for removal. It also defines the area of the chassis to which a latch is to interact when inserting and extracting (ejecting) a board.

An object of this invention is to meet these IEEE requirements for a latch for Compact PCI board installations, which allows for more efficient EMC shielding.

A second object of this invention is to provide a latch that needs a smaller cutout in the PCI board faceplate.

An third object of this invention is to provide such a latch that has a low profile when folded closed.

A further object of this invention is to provide such a latch with a greater degree of rotation and a two-phase operation.

An even further object of this invention is to implement such a two-phase operation by having the ejector successively operating first in a rotary motion and then secondly in a linear motion.

SUMMARY OF THE INVENTION

The objects of the present invention are realized in a low profile Compact PCI board latch, having a fold-down handle that operates with a greater degree of rotation, and has a separate alignment guide block, which facilitates its mounting to the board's faceplate and thereby requires a smaller faceplate aggregate cutout area thereby reducing EMF leakage and enhancing EMC compatibility.

The invention is an inject/eject latch, for mounting on the outside of a PCI board faceplate. This latch engages and disengages a chassis keeper, whereof the chassis environment, including the shape, position and size of the chassis keeper, is specified by IEEE standards for Compact PCI boards. The latch includes a claw-shaped pawl that engages and disengages from a flange-type keeper under a two-phase motion, whereof each motion is a movement, such as a rotation, about a separate and distinct point.

This pawl includes an elongate arm extension and an abutment shoulder with which fold-down latch handle operates. The fold-down handle rotates through 90 degrees from its flat, folded-down position to the upright standing position facing outwardly from the faceplate.

The latch has a base that is mounted to the outside face of the compact PCI board's faceplate with its entire structure being outboard of the PCI board faceplate. A separate alignment guide block mounts to inside face of the faceplate to extend inwardly towards the chassis connectors. The latch, including its base and the separate alignment guide block are mounted to the faceplate with but two screws. The two-phase operation of the pawl permits the faceplate to extend further beyond the outside edge of the board than with solely rotational movement pawls. This increases the EMF shielding and enhances EMC levels for the latch and faceplate combination.

The latch housing has two juxtaposed plates each carrying facing guide openings and facing pivot openings. A one-piece handle is assembled to ride on and pivot between the juxtaposed housing faces. A claw-shaped pawl is acted upon by the handle to first rotate into a small rectangular cutout opening and then to translate longitudinally into a flange-shaped keeper on injecting. A reverse path of motion of longitudinally withdrawing from the flange-shaped keeper and then rotating is carried out on ejecting.

A spring-biased, plate-shaped catch with a small projecting hook acts as a locking device in the folded-down position. Releasing the catch permits the latch's handle to be rotated upwardly.

From the fully inserted configuration/position, the user first rotates the spring loaded catch which in turn releases the handle from the base and permits it to be rotated outwardly from the board's faceplate. As the handle is rotated though the first 75 degrees, it pivots around the end of a central slot in the base halves (juxtaposed base plates). Slots in the end of the handle contact pins on the pawl. The pawl rotates around a pin and ejects the faceplate/board structure from the chassis connector by moving the board outwardly above the chassis keeper flange. A further 15 degree rotation of the handle causes the handle to pivot around the end of semi-circular slots in the base halves (juxtaposed base plates). The first slots now drive the pawl pins down vertical portions of "L"-shaped slots in the base plates, causing the pawl to disengage from the chassis keeper flange with a longitudinal movement. The board is now free to be removed (pulled) from the chassis. The ends of the pins on the pawl have a tear-drop shape which prevents them from beginning the vertical travel before the extraction rotation is completed (the full 75 degrees of rotation).

Insertion reverses the motion and sequence of operation of extraction. The insertion and the extraction is a two-step process. With extraction, the process uses first one pivot location for the handle acting on the pawl extension to provide the extract motion, and then uses a second pivot location for the handle to provide the linear disengagement movement. With injection the order sequence is reversed.

BRIEF DESCRIPTION OF THE DRAWINGS

The features, advantage and operation of the present invention will become readily apparent and further understood from a reading of the following detailed description with the accompanying drawings, in which like numerals refer to like elements, and in which:

FIG. 13 shows the latch of the present invention in the fully closed and locked position;

FIG. 14 shows the latch in the unlocked position with the catch depressed;

FIG. 15 shows the latch with the handle rotated to about the 75 degree position whereby the ejection step is about completed; and FIG. 16 shows the latch with the handle fully rotated to about 90 degrees and the latch fully open and free of the chassis keeper.

DETAILED DESCRIPTION OF THE INVENTION

The present invention is fold-down low profile inject/eject latch which meets IEEE standards for compact peripheral interconnection (PCI) boards. Such compact PCI boards have been standardized to have aluminum faceplates at their outermost edges. These faceplates primarily provide EMF shielding. The operation of this latch permits a construction/structure which yields enhanced EMC (electromagnetic compatibility) by permitting increased shielding and reduced EMF emissions past an IEEE standards PCI board faceplate. The design and operation of the present latch invention permits a reduction in the cumulative openings and the aggregate area of the openings through the board's faceplate, including the addition of lateral extensions to the faceplate outboard its side edges, which lateral extensions are a part of and within the scope of the present invention.

The invention creates a motion control of the pawl and handle that is created by separately and sequentially pivoting about two different pivot points. The fold-down handle of the latch swings through an arc of 90 degrees from a position parallel to the faceplate to one upstanding perpendicular to the faceplate. The sequential dual pivot point motion, coupled with an elongate slot, enable the pawl to transcribe two separate motions as it disengages from the chassis, the first being a pivoting eject motion against the keeper, and the second being a longitudinal withdrawal motion to release from the keeper. During the first 75 degrees of eject motion, the handle's rotation pivot point is located close to the pawl pin which the handle bears against. This short-coupled lever action is important to have during the first 75 degrees of eject motion of the handle's swing so as to maximize the mechanical advantage for ejecting from the printed circuit board/housing connectors with the least amount of effort on the handle during extraction sequence.

During the next 15 degrees of handle rotation (75-90 degrees), the handle pivot shifts to a second pivot point so as to pull on the pawl structure, and then to cause it to undergo a sliding translation away from the chassis keeper flange, thus freeing the board by completely disengaging the latch. Very light loads are present during this portion of the latches movement.

Ejection therefore, becomes a two-step process. The first step is rotating the handle to rotate the pawl to eject the board from its connectors. The second step is further rotating the handle to horizontally (laterally) translate (pull) the pawl out of engagement with the chassis keeper flange. This operation, and the resulting process is reversed for the injection process.

Figure 1:
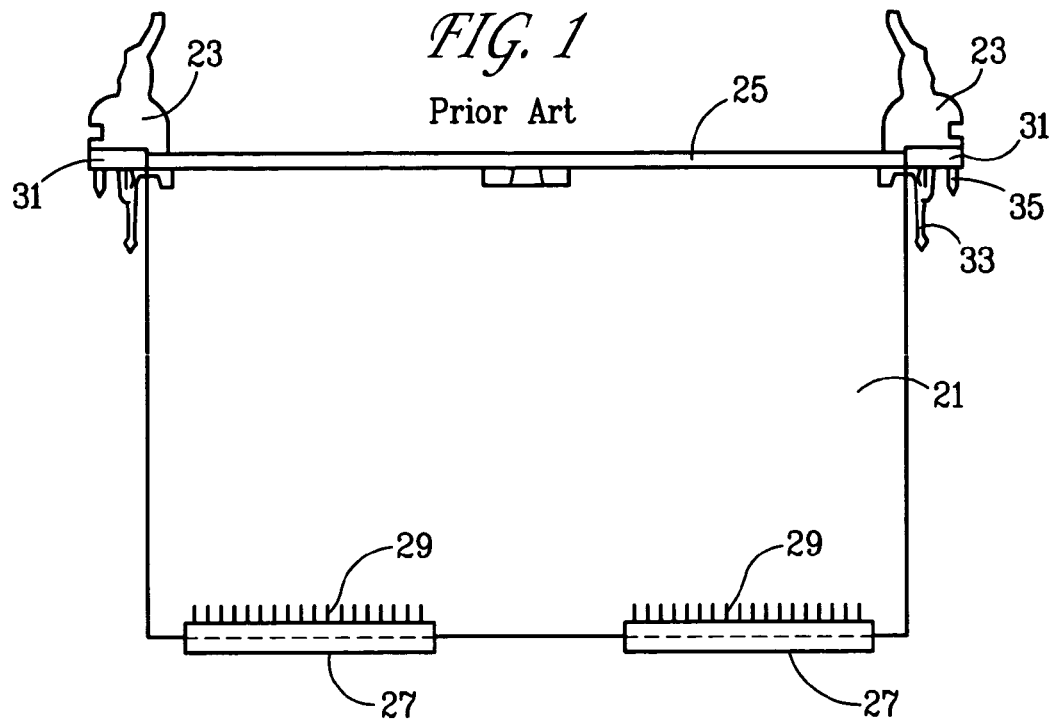
FIG. 1 is a side view of a prior art Compact PCI board with prior art inject/eject latches positioned on the faceplate.
Figure 2:
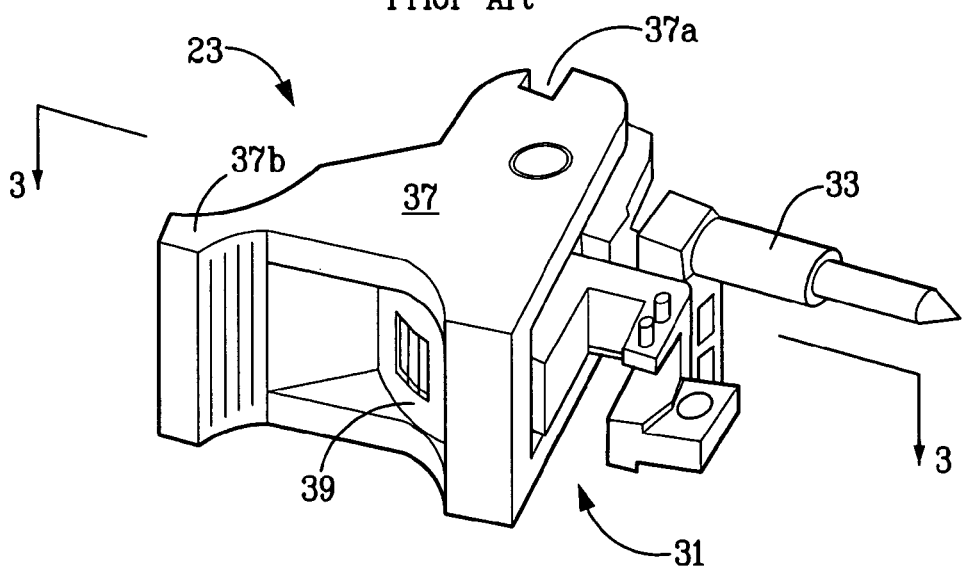
FIG. 2 is a perspective view of the prior art inject/eject latch of FIG. 1.
Figure 3:
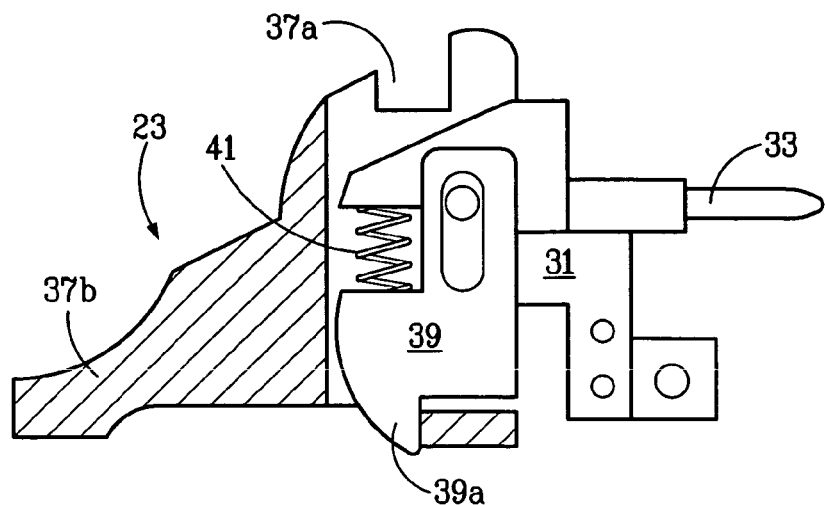
FIG. 3 is a longitudinal cross-sectional view of the prior art latch of FIG. 2 taken as shown in FIG. 2.
Figure 4:
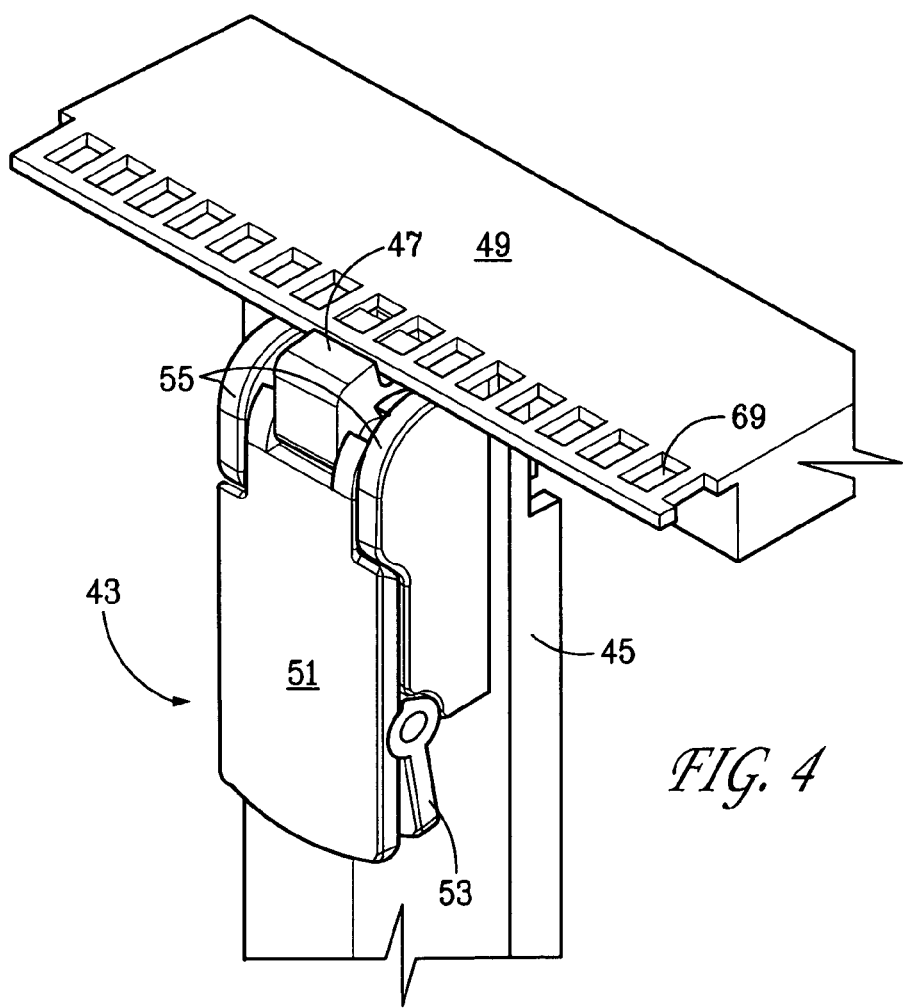
FIG. 4 is a perspective view of the latch of the present invention assembled on the faceplate of a Compact PCI board and engaging a chassis keeper.

FIG. 4 is a perspective top-wise view of the two-phase operation latch 43 of the present invention, mounted according to the IEEE standards to the outside of a PC board faceplate. The claw-shaped pawl 47 engages a flange-type keeper 49. In the closed position, as seen in FIG. 4, the latch 43 presents a low-profile, with its thumb-end handle 51 folded down parallel with the faceplate 45. A flat plate shaped catch 53 is mounted to pivot underneath the free end of the handle 51. The latch has a base (or housing) 55 comprised of two juxtaposed plates 55 mounted to either edge of the faceplate 45, FIGS. 4 and 5. These base plates 55 support the pawl, which operates there between, and the handle 51. These base plates 55 engage the faceplate end projecting tabs 57 which each carry a square (or rectangular) slot 59 into which a respective foot 61 on each base plate 55 seats.

Figure 5:
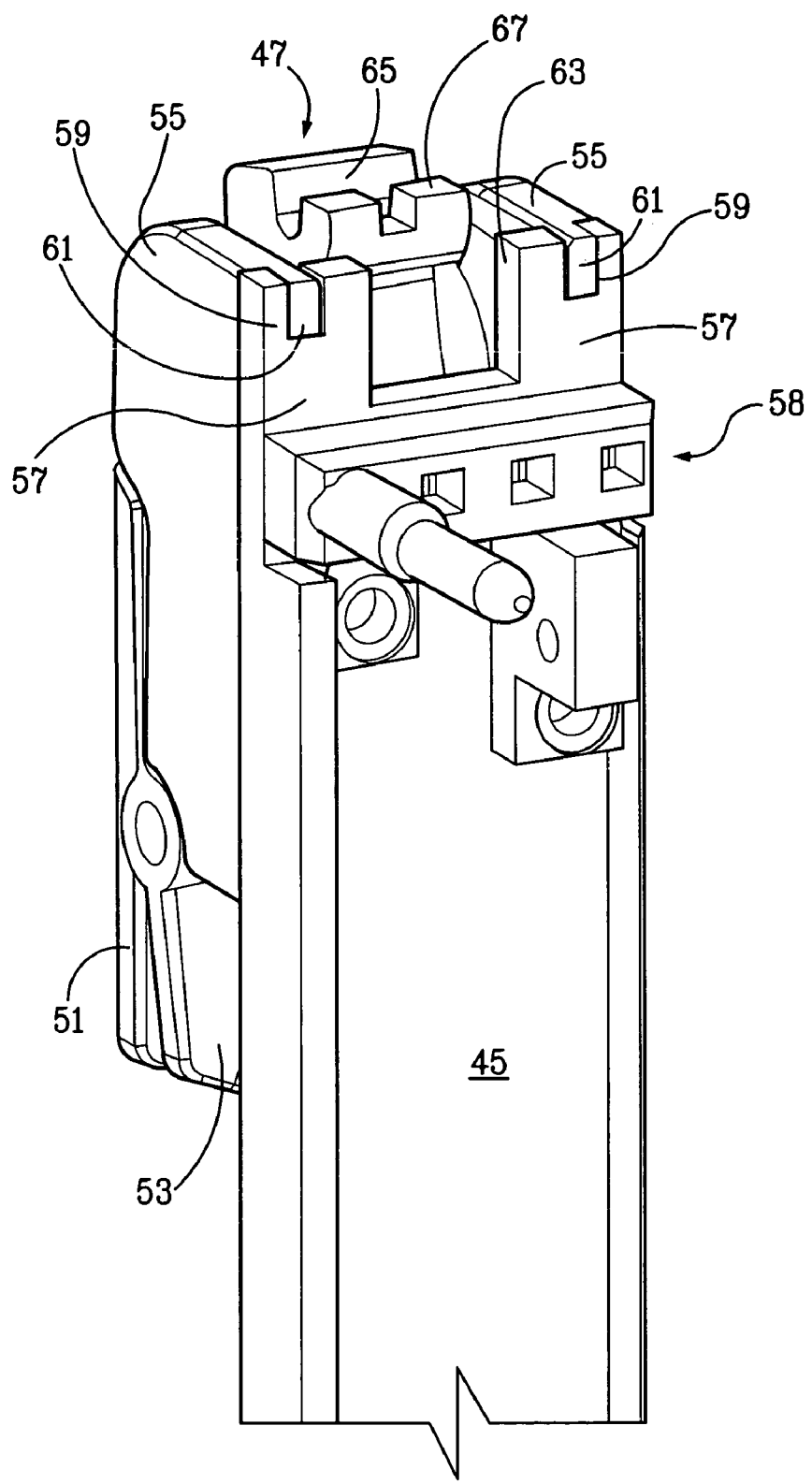
FIG. 5 is a perspective view of the latch of the present invention assembled on the faceplate of a Compact PCI board with the board removed, the view is from the bottom of the latch, i.e., the inboard face of the faceplate.

The outboard extension of the faceplate 45 comprising the projecting tabs 57, the interlocked base plate feet 61, and the rectangular pawl opening 63, FIG. 5, are new with the present invention and a part hereof. This added structure extends the faceplate shielding further than previously available and enhances EMC by providing greater EMF shielding. The claw portion of the pawl 47 has a solid bar upper lip 65 and a bifurcated lower lip 67. This bifurcated lower lip 67 creates a pair of parallel projecting feet, which engage the adjacent openings 69 in the chassis keeper plate shown in FIG. 4.

Figure 6:
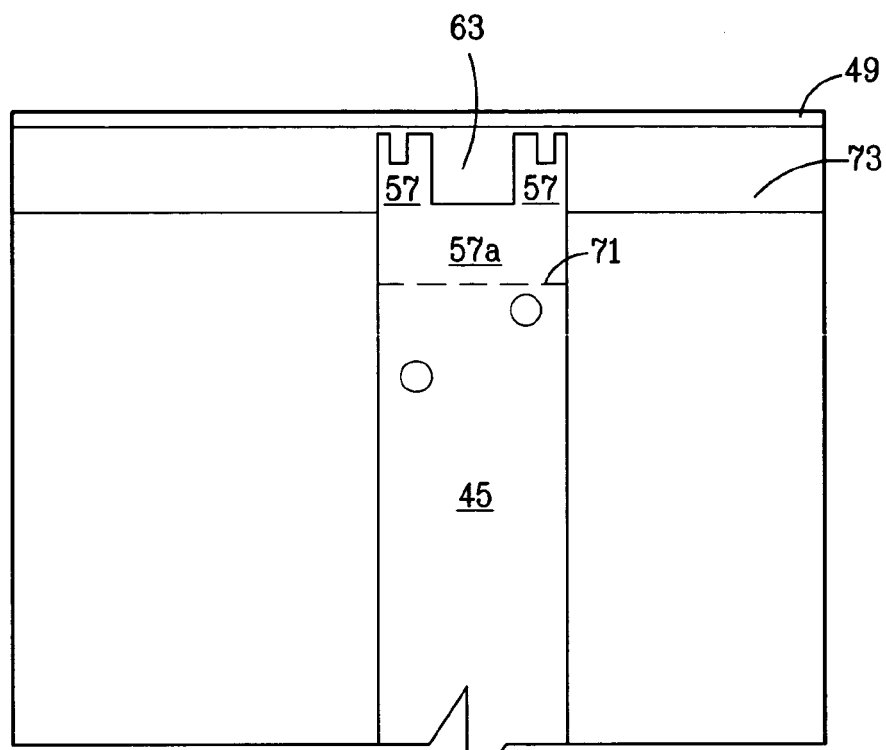
FIG. 6 is a bottom/inboard view of the PCI board faceplate showing a detail of the two mounting screw holes and the faceplate extension permitted by the unique operation of the latch of the present invention.

The faceplate 45, FIG. 6, previously terminated in a square shoulder 71 which was spaced from the edge of the chassis keeper flange 49, and slightly inboard of the spacing 73 provided for the operation of a pawl.

This invention has added an extension 57a and associated structure onto the end of the faceplate, this being the solid portion 57a and a pair of outboard side tabs 57 extending there from. The rectangular (or square) slots 59, which receive the feet 61 of the latch's left side and right side base plates 55, each open onto the outboard edge of each tab 57.

Figure 7:
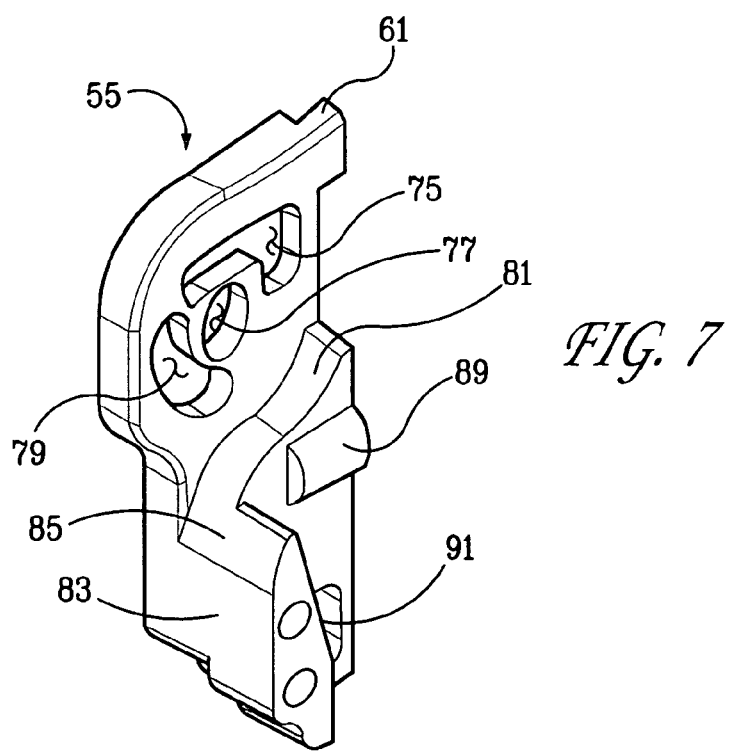
FIG. 7 is a perspective view of the left sidewall of the base for the latch of FIGS. 5-6 showing the inside face thereof.
Figure 7A:
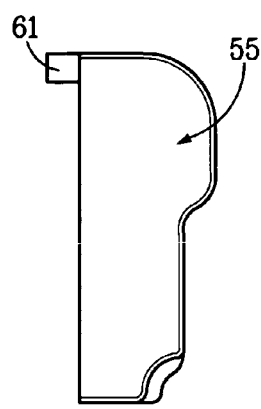
FIGS. 7a-7e are outside, inside, top, claw-end, and thumb handle end views, respectively, of the left sidewall shown in FIG. 7.
Figure 7D:
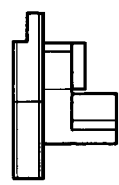
Figure 7B:
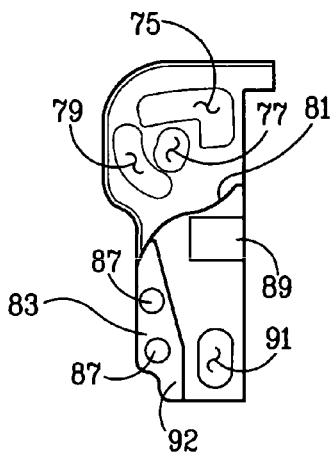
Figure 7C:
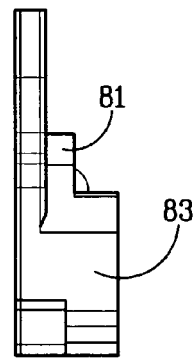
Figure 7E:
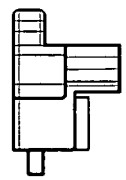

The left base plate 55 is shown in perspective view in FIG. 7 and carries on the inside wall facing the opposite or right side base plate 55, that side being its mirror image. There is an L-shaped cam slot 75 near the pawl end thereof and above the foot 61, FIGS. 7a-7e. Adjacent this L-shaped slot is an oval-shaped pivot opening 77 with the rearward portion slightly cocked upward. Above the oval-shaped pivot opening 77, and also being rearward towards the handle end of the plate 55, is a arc shaped slot 79 traversing and arc distance of about 90 degrees about the oval-shaped pivot opening 77.

A French curve-like ramp surface 81 projects from the inward face of each base plate, to extend rearward of the arc shaped slot 79, beginning just about below the edge of the oval-shaped pivot opening 77 and extending to a rearward positioned top planer surface 83 with a tapered leading edge 85. This planer surface 83 which is formed on a shoulder structure has a ramped surface and a flat surface and carries a pair of holes 87 for assembly pins. A partial-cylindrical spacer 89 projects outwardly from the inner face of the curve-like surface ramp 81. A further, longitudinally extending slot 91 extends adjacent the planer surface 83 and below the projecting cylindrical spacer 89.

Figure 8:
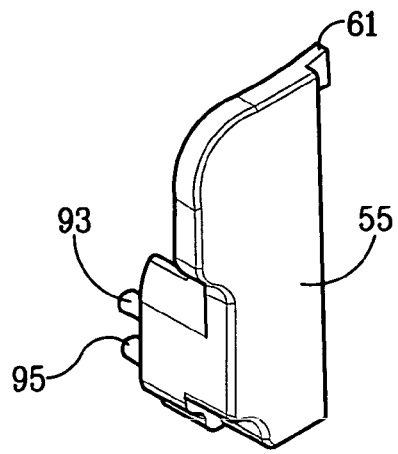
FIG. 8 is a perspective view of the right sidewall of the base for the latch of FIGS. 5-6, showing the outside face thereof, with the left sidewall and right sidewall of the base having, respectively, inside face cavities, projections, ramps and journals being mirror images.

The right base plate 55, shown in FIG. 8 and in the respective various views FIGS. 8a-8e, are each respective mirror images of the left base plate, shown in FIG. 7, and the respective side, top, and end views FIGS. 7a-7e. The only departure from this mirror imaging is the pair of assembly pins 93 which extend inwardly from the inner face of the right respective planer surface 83 structure.

Figure 9:
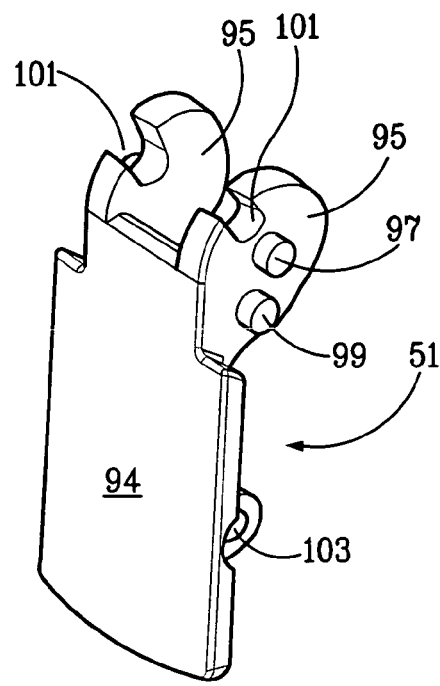
FIG. 9 is a perspective view of the thumb handle member for the latch of FIGS. 5-6.

The thumb handle 51 is shown in detail in the perspective view, FIG. 9, and in the respective side, top, and end views FIGS. 9a-9e. Thumb handle 51 has a thumb engaging flat gripping portion 94 and a pawl engaging portion. The pawl engaging portion comprises the two parallel extending C-shaped (round) pawl engaging pickup plates 95. Each pickup plate 95 has a curved outer edge and an outwardly projecting center pivot pin 97, which engages the oval-shaped pivot opening 77, in an adjacent, respective right and left side base plate 55. A second, rearward positioned cam pin 99 engages the arc shaped slot 79, in a respective side base plate 55, and controls the degree of pivoting of the handle 51 and its gripping portion, from the horizontal to the vertical, for traversing 90 degrees of rotation.

The pickup plates 95 each have a pickup slot 101. Each slot 101 has a curved bottom and parallel faces. The pickup slots 101 are paired to engage a respective projecting pin on the pawl 47 which will be discussed below. A pivot boss 103 is positioned on the bottom face of the thumb gripping portion 93 slightly inboard of the free end thereof, thereby providing a structure for the catch plate 53 to pivot on.

Figure 10:
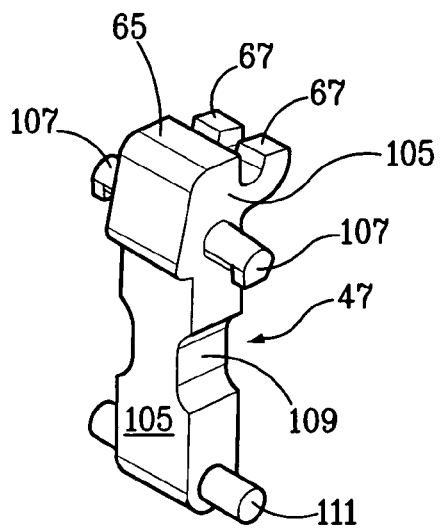
FIG. 10 is a perspective view of the claw-shaped pawl with elongate arm for the latch of FIGS. 5-6.

The claw-shaped pawl 47 is shown in FIG. 10 in a perspective view, and in a side, top and end views, respectively, in FIGS. 10a-10e. This pawl has the upper lip 65 and lower bifurcated lip 67 at one end and an elongate bar-shaped body extending rearward there from. Approximate the claw end 105 of the pawl is a pair of tear-drop shaped pivot pins 107, each with a cam lobe 107a at the end thereof, to form a tear-drop end shape. These pivot pins 107 extend outwardly from each side of the pawl 47 and are the pivot stub shafts thereof.

The elongate body 105 of the pawl 47 has paired opposite sidewall bump-ins 109, each of which ride-against a respective partial cylindrical spacer 89. Cam pins 111, one on each side of the rearward end of the pawl body 105 mate with a respective one of the rearward facing longitudinal cam slots 91 in a respective side base plate 55.

The stub shafts 107 ride in the L-shaped cam slots 75 of a respective side base plate 55. This L-shaped slot 75 allows the pawl 47 to first rotate and lift the latch 43 and attached faceplate 45 upward, and then forces the pawl to retract horizontally rearward (traverse the horizontal leg of the "L") once the full length of the upward leg of the "L" has been traversed.

The tear-drop shaped stub shafts 107 are also simultaneously engaged with the pickup slot 101 of the handle 51 pickup plates 95. The creates the movement of the pawl 47 when the handle 51 is moved. The L-shaped slot 75 and the rear horizontal slot 91 provide the primary direction of motion. The elongation of the oval-shaped pivot opening 77 and the cam lobe 107 forming the tear-drop shaped stub shafts 107 refine the motion.

Figure 11:
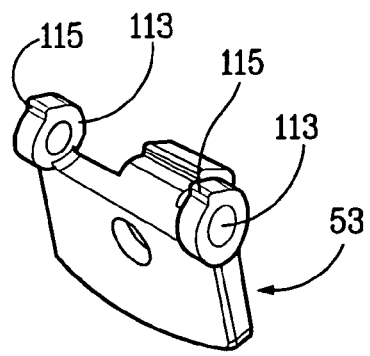
FIG. 11 is a perspective view of the catch for the latch of FIGS. 5-6.

The catch plate 53 is shown in FIG. 11 in a perspective view, with the top, side and end views, respectively shown in FIGS. 11a-11e. This catch plate 53 has paired outside journals 113 though which a shaft (not shown) extends to mount the catch plate 53 on the paired catch pivot bosses 103 on the handle 51. A projection 115 on the circumference of each outside journal 113 limits the movement thereof. The inside face of the catch plate 53 carries a circular cavity 117 for holding a compression spring 119 shown in FIG. 13. This spring acts to bias the catch plate 53 away from the bottom of the flat thumb gripping portion 94 of the handle 51.

A transversely projecting hook 121 extends from the inboard edge of the catch plate 53 towards the bottom face of the handle 51. This hook 121 engages the very rearward edge 92, seen in FIGS. 7b, 8b, of each of the right and left side base plates 55 shown in FIGS. 7b and 8b, to hold the handle 51 in a fixed position with regards to the base plates 55 and fixed parallel to the faceplate 45. Pushing against the catch 53 to depress the spring 119 moves the hook 121 and permits the handle 51 to rotate.

Figure 12:
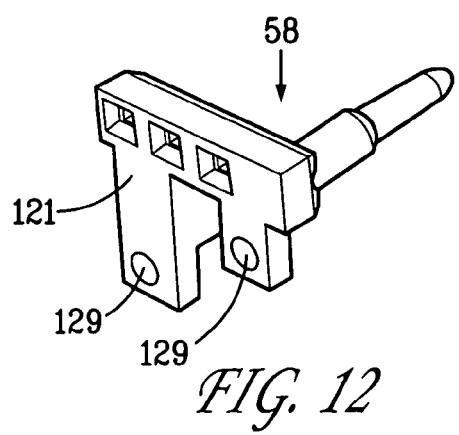
FIG. 12 is a perspective view of the alignment pin block for the latch of FIGS. 5-6.
Figure 8A:
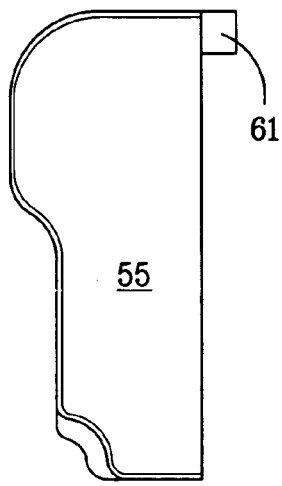
FIGS. 8a-8e are outside, inside, top, claw-end, and thumb handle end views, respectively, of the left sidewall shown in FIG. 8.
Figure 8B:
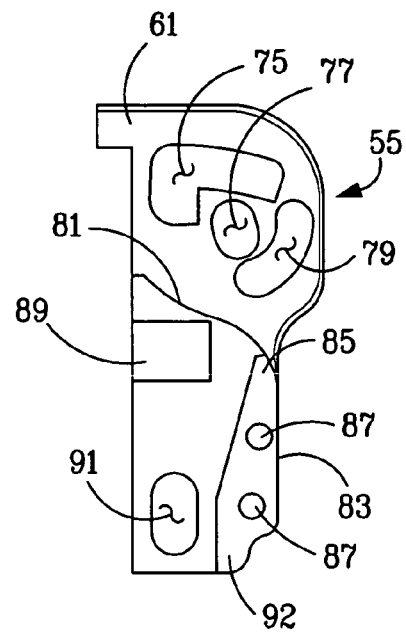
Figure 8C:
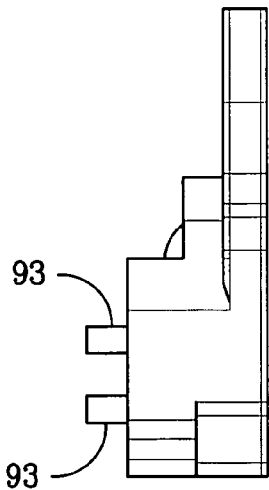
Figure 8D:
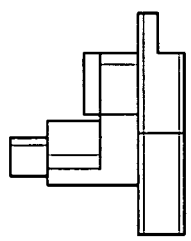
Figure 8E:
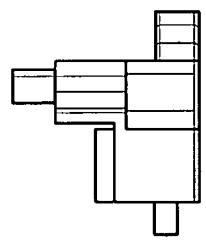
Figure 9A:
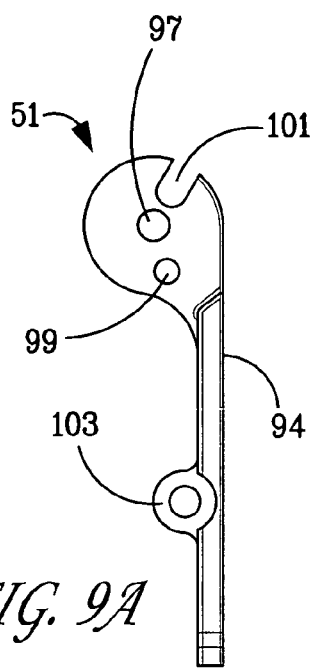
FIGS. 9a-9e are left side, right side, top, claw-end and thumb grasping-end views, respectfully, of the handle of FIG. 9.
Figure 9B:
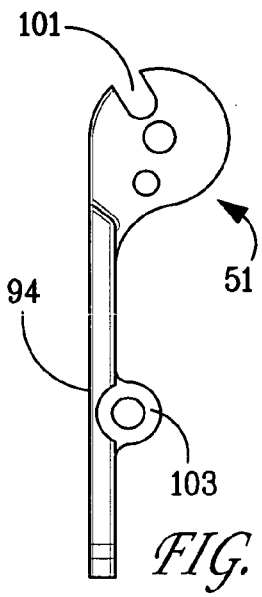
Figure 9C:
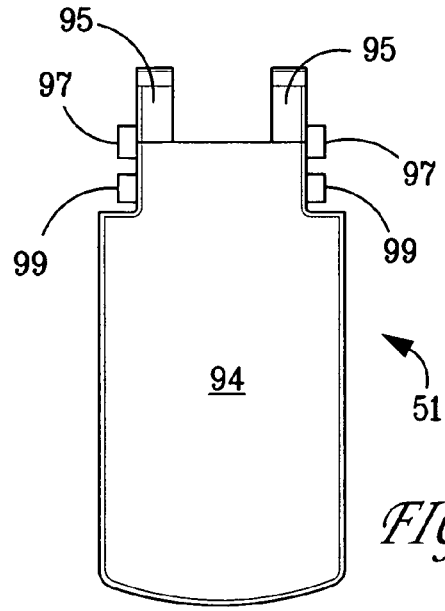
Figure 9D:
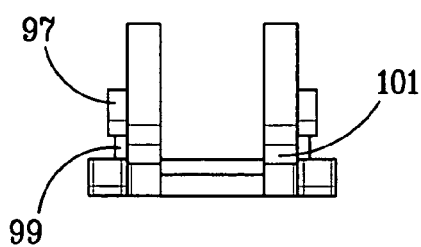
Figure 9E:
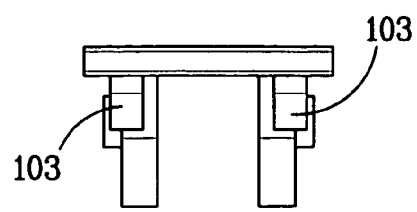
Figures 10A, 10B, 10C:
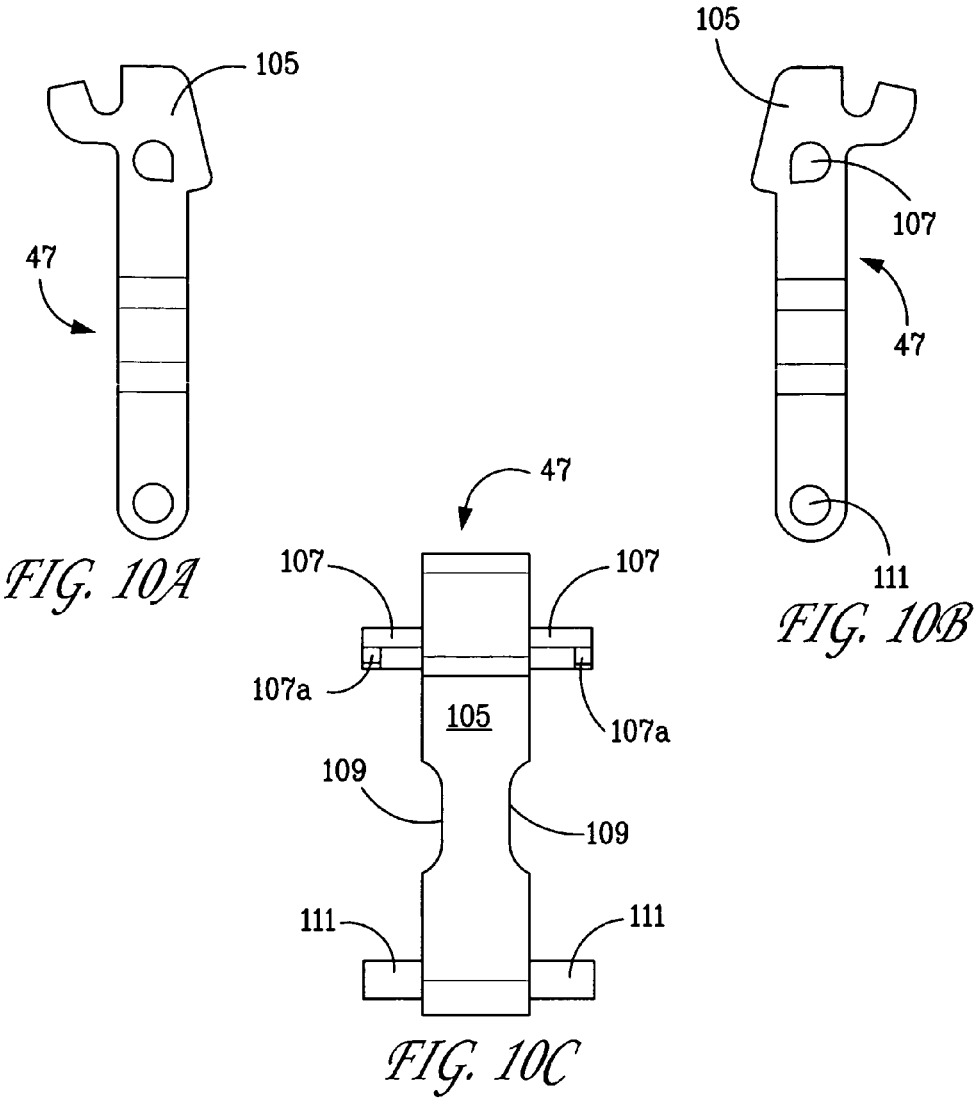
FIGS. 10a-10e are left side, right side, top, claw-end and thumb/catch-end views, respectively, of the pawl of FIG. 10.
Figures 10D, 10E:
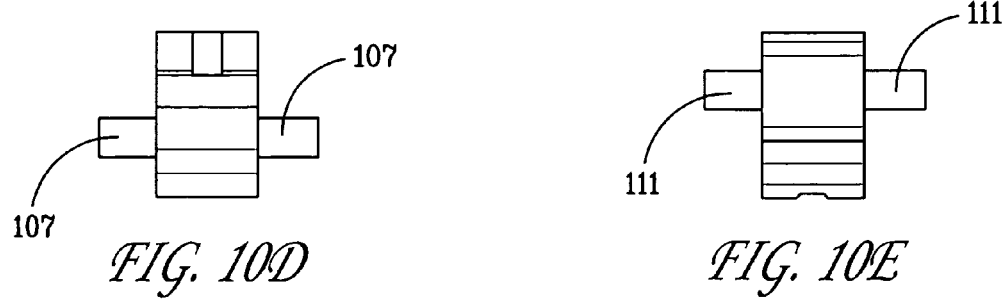
Figure 11A:
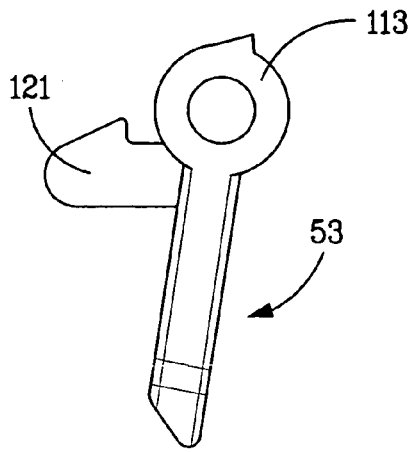
FIGS. 11a-11e are left side, right side, top, catch tang-end, and free-end views, respectively, of the catch of FIG. 11.
Figure 11B:
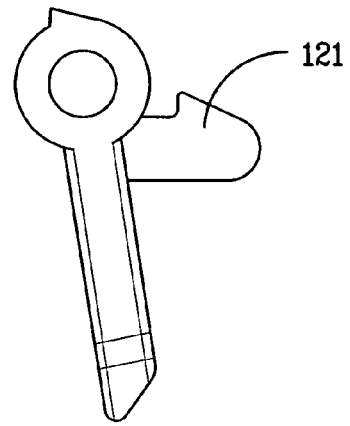
Figure 11C:
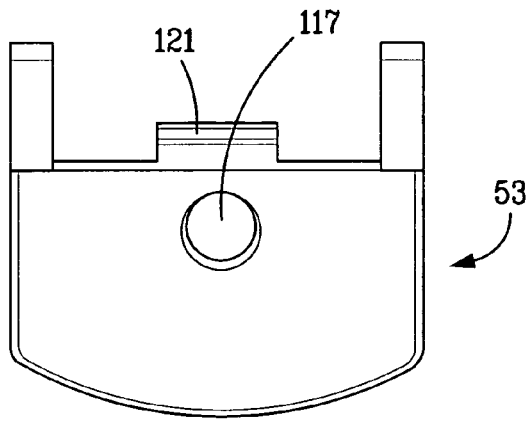
Figure 11D:
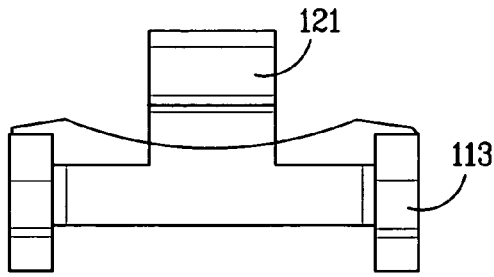
Figure 11E:
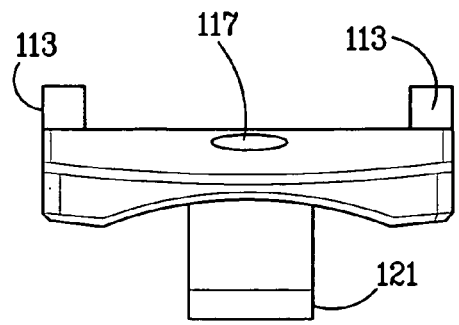
Figure 12A:
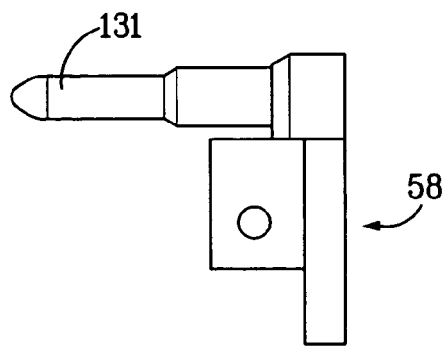
FIGS. 12a-12e are left side, right side, faceplate side, inboard side, and outboard views, respectively, of the alignment pin block of FIG. 12.
Figure 12B:
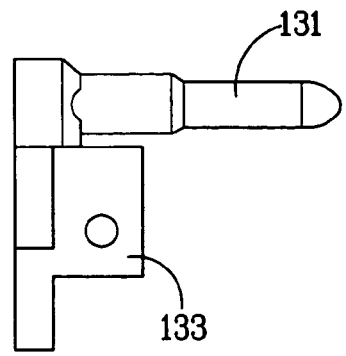
Figure 12C:
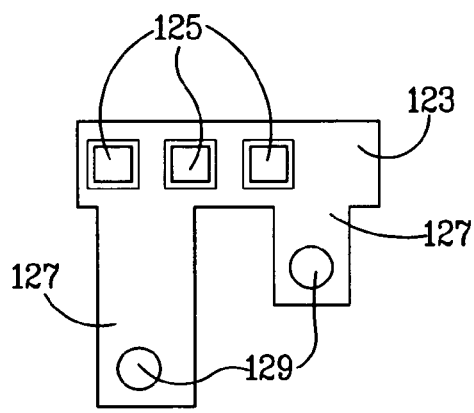
Figure 12D:
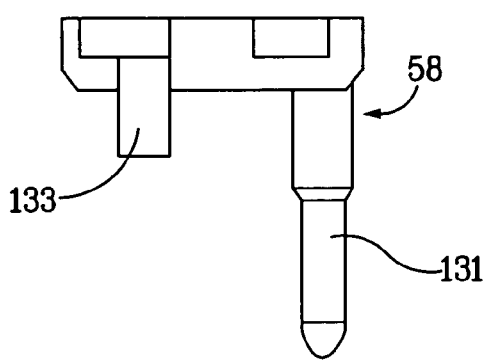
Figure 12E:
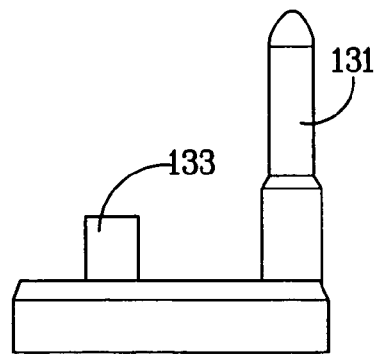

The separate alignment pin block structure 58, FIG. 5, is shown in detail in the perspective view of FIG. 12. The back, side and end views, respectively, of this alignment pin block 58 are shown in FIGS. 12a-12e. This block 58 has a bracketed back plane 123 with a plurality of rectangular through-holes 125 and two mounting tabs 127 each with a screw hole 129. A larger tapered lead guide pin 131, with successive diameters each leading into with a tapered shoulder, extends from the larger of the two tabs 121. A cylindrical stub pin 133, which acts as the smaller seating pin, extends from the smaller of the two tabs 121.

FIG. 13 shows the latch 43 in the closed and locked position. FIG. 14 shows the latch 43 after it has been unlocked by moving the catch 53 to have its hook 121 release the base 55. FIG. 15 shows the latch after the handle 51 has been rotated to about 75 degrees of rotation. This is the transition for the pawl 47 to change over from rotational motion to rearward, horizontal, longitudinal motion. This occurs at the point where the lower bifurcated lip 67 has fully lifted the board 21 out of its connector socket. FIG. 16 shows the handle 51 fully rotated to the 90 degree position and the pawl 47 with its chassis 49 engaging upper and lower lips 65, 67 free of the chassis flange 49.

Referring to FIGS. 13-16, from the fully inserted configuration (closed) FIG. 13, latch is moved to the unlocked position, FIG. 14, then to the board ejected position, FIG. 15, and finally to the fully open position, FIG. 16. Reinsertion of a board reverses the process.

In operation, the pawl 47 undergoes two distinct motions, those being first rotating against a portion of the chassis to eject the PCI board (by ejecting the face plate 45), then sliding out of the way to disengage itself from the chassis frame 49. The handle 94 accomplishes this two-motion pawl operation in one 90 degree rotational stroke of the handle 94, utilizing a "short-coupled" mechanical advantage during the pawl's rotation and ejection during the first 75 degrees of handle rotation, and then with a longer-coupled lever action during the remaining 15 degrees of handle rotation, whereby the pawl is more rapidly disengaged by its longitudinal sliding away from the chassis engagement position.

The secondary catch hook 121 keeps the handle positively locked in the closed position until it is released. The catch 53 must be operated to release the hook 121 to in turn release the handle 94 for its operation.

The compound operation of the latch is accomplished because the handle and pawl pivot about two separate pivot points, one being a real pivot point and the second being a "virtual" pivot point.

For unlocking, ejecting and withdrawing a compact PCI board, the user first rotates the spring-loaded catch 53, which releases the hook 121 from the base side plate 55 and allows the handle 51 to be rotated. As the handle 51 is rotated through 75 degrees, it pivots around the position "A" of the central elongate slot 77 in the base plates 55. Slots "B" in the end of the handle 51 contact (ride on) the pins at position "C" on the pawl. The structure of the device thereafter allows a longitudinal movement of the handle away from the pivot position "C" by the sliding along the slots "B" of the handle 94. The elongation of slots 77 and 91 permits this withdrawal of the pawl 47 from the chassis. The total amount of rotation of the pawl 47 from the closed position to the fully open position is about 15 to 20 degrees. This permits a small pawl opening 63 in the faceplate extension 57a thereby minimizing EMF leakage and enhancing EMC compatibility.

The pawl rotates around the pin at position "D", i.e., the cam pins 111 engaging the respective longitudinal slots 91, and ejects the faceplate 45 and its attached PCI board from the chassis 49. This ejection operation is under the leverage of the entire length of the pawl arm from pivot pin 107 to cam pin 111. A further 15 degree rotation of the handle causes it to pivot around the end of the arc slots at position "E", these being the arc slots 79 in the base halves, i.e., base plates 55.

The pawl pins 107 first move along the horizontal leg of the L-shaped slots 75, then down the vertical leg of these slots 75. In this regard, slots "B" drive the pawl pins "C" down the vertical portion of the L-shaped slots 75 in the base halves 55, causing the pawl 47 to retract in order to disengage from the chassis 49 and allowing the PCI board to then be removed from the chassis. The ends of the pins "C" have a tear-drop shape, lobe 107a, which prevents them from beginning the vertical travel before the extraction rotation is completed.

Insertion of the PCI board take an opposite sequence of operation and a reversal in travel paths. In the fully closed and the unlocked positions, FIGS. 13, 14, the handle 94 is close to the chassis 49 and the round pickup plates 95 of the handle are off of the curved ramp surface 81 of the base plates 55. When the latch is in the fully open position, FIG. 16, the handle not only rotated, but has also laterally translated to have moved away from the chassis 94 and the round pickup plates 95 abut the curved ramp surfaces 81.

Many changes can be made in the above-described invention without departing from the intent and scope thereof. It is therefore intended that the above description be read in the illustrative sense and not in the limiting sense. Substitutions and changes can be made while still being with the scope of the appended claims.

What is claimed is:

1. An eject/inject latch for electronic component board, being mountable thereon, said component board being mountable in a chassis having a keeper member, comprising:
    a pawl suitable for engaging a chassis mounted keeper;
    a handle connected to said pawl for operating said pawl into and out of engagement with said keeper;
    first camming means connected to said handle for guiding said handle motion in a rotary motion about a first pivot point and thereafter guiding said handle motion in a rotary motion about a second pivot point; and
    second camming means connected to said pawl for guiding said pawl in separate and sequential motions being a rotary motion and a longitudinal motion the order of said motions being dependent upon the inject or eject function.

2. The latch of claim 1, also including a base, wherein said handle rotation about said first and second pivot points is with respect to said base, and wherein said pawl rotary motion and said longitudinal motion is with respect to said base and to said keeper.

3. The latch of claim 2, wherein said base includes a pair of spaced apart mirror image base plates said base plates each including a plurality of mirror image slots, wherein a first portion of said slots controls said handle pivot point location and a second portion of said slots controls the sequential motion of said pawl.

4. The latch of claim 1 wherein said handle is elongate and has a pick-up slot at a first end thereof, a pivot pin adjacent said pick-up slot, and a cam pin off-set from said pivot pin.

5. The latch of claim 4, wherein said handle also includes a transversely projecting hook mounted adjacent the end opposite said pick-up slot, and a catch lever connected to said handle for operating said projecting hook.

6. The latch of claim 4, wherein said pawl has an elongate arm portion with a claw-shaped chassis engagement portion at one end, said pawl also having tear-drop shaped pivot stub shafts adjacent said claw-shaped portion, and cam pins at said opposite end of said pawl arm.

7. The latch of claim 6, also including a base carrying said camming means, said camming means including an L-shaped cam slot wherein a said pawl tear-drop shaped stub shaft operates, a first oval pivot opening wherein a said handle pivot pin operates, and an arc slot wherein a said handle off-set cam pin operates.

8. An eject/inject latch for electronic component board, being mountable to a face plate thereon, comprising:
a pawl suitable for engaging a keeper;
a handle connected to said pawl for operating said pawl;
camming means for guiding said handle in a rotary motion sequentially about two separate pivot points, and for guiding said pawl in a rotary and then in a longitudinal motion, said camming means having a base supporting said pawl and said handle, said base including a pair of spaced apart plates connectable to said component board faceplate, each base plate having a plurality of slots; and
a detachable alignment block connectable to said latch once said latch is mounted to said faceplate.

9. The latch of claim 8, also including a faceplate extension including projecting tabs and a pawl opening through which said pawl operates.

10. The latch of claim 9, wherein said detachable alignment block is connected to said latch by screws extending through said extension tabs.

11. An injector latch for a PCI board, said PCI board having a faceplate, comprising:
a base member mountable on said faceplate;
a faceplate extension having projecting tabs with a slot in each tab, each said tab slot being abutted to said base member;
an alignment block connectable to said base member;
a claw-shaped pawl carried on said base member for engagement with a keeper; and
a handle carried on said base member and operable to move said pawl
wherein said pawl rotates and then laterally withdraws from said keeper as said handle is operated for the latch opening operation.

12. The injector latch of claim 11, also including a catch for locking said handle to said base member.

13. The injector latch of claim 12, wherein said catch includes a plate member, a hook member projecting transversely from said plate member, and a biasing spring, said plate member being pivotally connected to said handle.

14. The injector latch of claim 13, wherein said pawl rotates about 15 degrees as said handle is opened about 75 degrees, and wherein said pawl is laterally withdrawn as said handle rotates open from about 75 to 90 degrees.

15. An injector-ejector latch, comprising:
a base member;
a pawl connected to said base member for engaging a keeper position; and
a handle connected to said pawl and said base member, said handle being rotatably operable from a closed position to a fully open position;
wherein as said handle is rotated about a first pivot point from said closed position to a position intermediate before said fully open position whereby said handle causes said pawl to rotate from a first closed position to a second intermediate position; and
wherein as said handle is thereafter rotated about a second pivot position from said handle intermediate position to said fully open position, whereby said handle causes said pawl to laterally retract from said keeper position, said pawl rotation and lateral retraction motions being separate and sequential.

16. The injector-ejector latch of claim 15, wherein said base member carries an arc slot opening, an L-shaped slot opening, and a first and second elongated pivot openings.

17. The injector-ejector latch of claim 15, wherein for said inject function, the movement of said handle and of said pawl are in reverse order.

18. An injector-ejector latch, comprising:
a base member carrying an arc slot opening, an L-shaped slot opening, and a first and second elongated pivot openings;
a pawl connected to said base member;
a handle connected to said pawl and said base member, being rotatably operable between a closed and fully open positions, wherein as said handle rotation reaches an intermediate position between closed and fully open, said handle causes said pawl to rotate from a first closed position to a second position, and as said handle is rotated from said intermediate position to said fully open position, said handle causes said pawl to laterally retract to complete said eject function;
wherein said pawl has a first pivot pin including a tear-drop shaped lobe, said pawl first pivot pin engaging said base member L-shaped slot opening, and a second pivot pin engaging said base member second elongated pivot opening.

19. The injector-ejector latch of claim 18, wherein said handle has an open-ended slot opening at first end thereof, a first pivot pin adjacent said handle open-ended slot opening wherein said handle first pivot pin engages said base member first elongated pivot opening, and a second pivot pin adjacent said handle first pivot pin wherein said handle second pivot pin engages said base member arc slot opening.

20. The injector-ejector latch of claim 19, wherein said base member includes a cylindrically shaped spacer, and wherein said pawl includes a bump-in for engaging said base member spacer, wherein each of said pawl and said handle pivot pins cams against their respective engaged opening for longitudinal movement there within, and wherein said latch also includes a catch member having a plate member pivotally attached to said handle and a hook member engageable with said base member, said plate member being resiliently biased to the open position away from said handle.

21. The injector-ejector latch of claim 20, wherein said base member also includes an abutment surface and wherein said handle abuts said base member abutment surface when said handle is in the fully open position.

22. The injector-ejector latch of claim 18, wherein for said inject function, the movement of said handle and of said pawl are in reverse order.

* * * * *

UNITED STATES PATENT AND TRADEMARK OFFICE
CERTIFICATE OF CORRECTION

PATENT NO.         : 7,397,674 B2
APPLICATION NO. : 10/852480
DATED                 : July 8, 2008
INVENTOR(S)      : Richard E. Schlack Page 1 of 1

It is certified that error appears in the above-identified patent and that said Letters Patent is hereby corrected as shown below:

Column 1, line 22, replace "six (6) inch" with --six (6) inches--;
Column 2, line 16, replace "An third object" with --A third object--;
Column 3, line 10, replace "rotated though" with --rotated through--;
Column 4, line 38, insert --a-- after "is";
Column 5, line 60, replace "a arc shaped slot" with --an arc shaped slot-- and replace "and arc distance" with --an arc distance--;
Column 6, line 55, replace "(traverse the horizontal leg of the "L)" with --(traverse the horizontal leg of the "L")--;
Column 6, line 59, replace "The creates" with --This creates--;
Column 7, line 1, replace "though" with --through--;
Column 8, line 29, replace "board take an" with --board takes an--;
Column 8, line 41, replace "being with the scope" with --being within the scope--.

Signed and Sealed this

Ninth Day of September, 2008

JON W. DUDAS
*Director of the United States Patent and Trademark Office*